(12) United States Patent
Nomoto (10) Patent No.: US 8,291,820 B2
(45) Date of Patent: Oct. 23, 2012

(54) INTAGLIO PRINTING PLATE, PRODUCTION METHOD FOR INTAGLIO PRINTING PLATE, PRODUCTION METHOD FOR ELECTRONIC SUBSTRATE, AND PRODUCTION METHOD FOR DISPLAY DEVICE

(75) Inventor: Akihiro Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 436 days.

(21) Appl. No.: 12/465,400

(22) Filed: May 13, 2009

(65) Prior Publication Data

US 2009/0283000 A1 Nov. 19, 2009

(30) Foreign Application Priority Data

May 14, 2008 (JP) ................................ 2008-126823

(51) Int. Cl.
*G03F 7/00* (2006.01)
*B41F 9/01* (2006.01)

(52) U.S. Cl. ......... 101/153; 430/307; 101/152; 101/170
(58) Field of Classification Search .................. 101/153
See application file for complete search history.

(56) References Cited

FOREIGN PATENT DOCUMENTS

| JP | 2006167937 A | * | 6/2006 |
|---|---|---|---|
| JP | 2006-231827 | | 9/2006 |
| JP | 2007-05445 | | 1/2007 |
| JP | 2007-160769 | | 6/2007 |

* cited by examiner

*Primary Examiner* — Joshua D Zimmerman
(74) *Attorney, Agent, or Firm* — K&L Gates LLP (57) ABSTRACT

An intaglio printing plate includes a substrate and a photosensitive resin film provided on the substrate. The photosensitive resin film includes a plurality of concave patterns whose depths increase as aperture widths increase.

3 Claims, 9 Drawing Sheets

INTAGLIO PRINTING PLATE, PRODUCTION METHOD FOR INTAGLIO PRINTING PLATE, PRODUCTION METHOD FOR ELECTRONIC SUBSTRATE, AND PRODUCTION METHOD FOR DISPLAY DEVICE

CROSS REFERENCES TO RELATED APPLICATIONS

The present application claims priority to Japanese Priority Patent Application JP 2008-126823 filed in the Japan Patent Office on May 14, 2008, the entire content of which is hereby incorporated by reference.

BACKGROUND

The present application relates to an intaglio printing plate, a production method for an intaglio printing plate, a production method for an electronic substrate, and a production method for a display device. More particularly, the present application relates to an intaglio printing plate for use in reverse printing, a production method for the intaglio printing plate, and a production method for an electronic substrate and a production method for a display device using an intaglio printing plate obtained by the production method.

In recent years, application of reverse printing to formation of a conductive pattern has been examined in production of electronic substrates, such as driving substrates (so-called back planes) for display devices, in order to achieve a lower cost and a finer pattern.

Figure 10A:
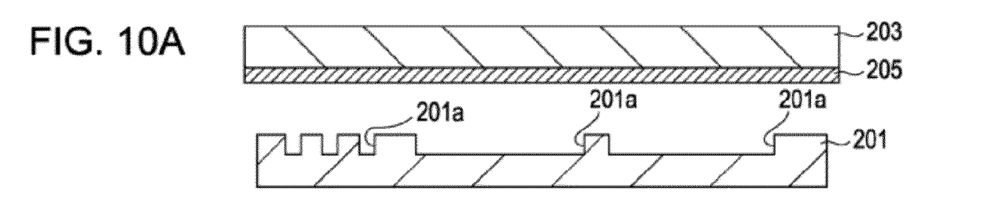
FIGS. 10A to 10E are cross-sectional step views illustrating the related art and problems thereof.
Figure 10B:
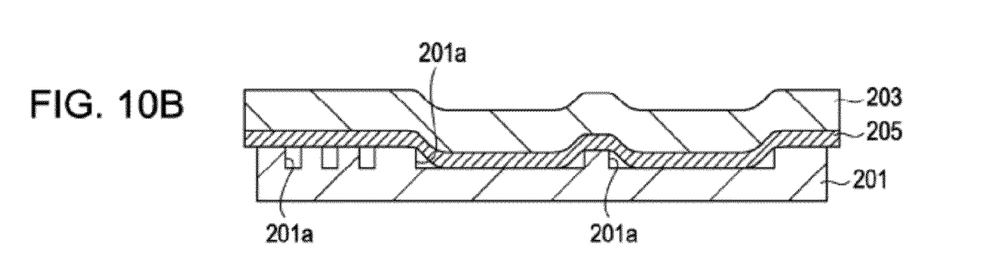
Figure 10C:
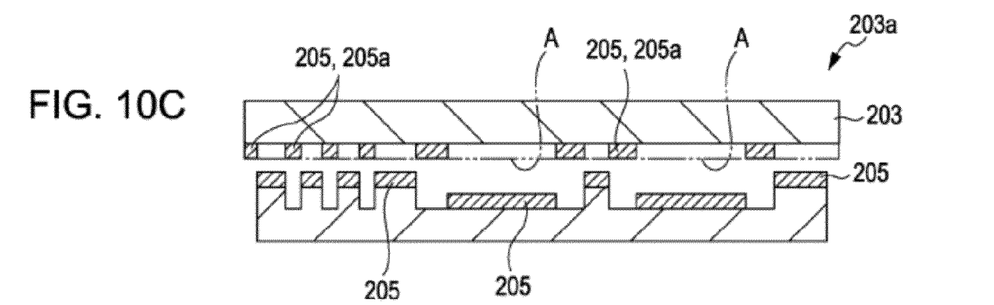

A conductive pattern is formed by reverse printing as follows:

First, an intaglio printing plate 201 is formed, as shown in FIG. 10A. The intaglio printing plate 201 is provided with depressions 201a corresponding to a conductive pattern to be formed. Further, a film of a conductive ink 205 is formed on a releasable surface of a blanket 203. Next, as shown in FIG. 10B, a surface of the blanket 203 on which the conductive ink 205 is provided is pressed into tight contact with a surface of the intaglio printing plate 201 on which the depressions 201a are provided. Then, as shown in FIG. 10C, the conductive ink 205 is transferred onto the contact surface of the intaglio printing plate 201 by peeling the blanket 203 off the intaglio printing plate 201, so that a printing plate 203a in which the conductive ink 205 partly remains as an ink pattern 205a on the releasable surface of the blanket 203 is obtained.

Figure 10D:
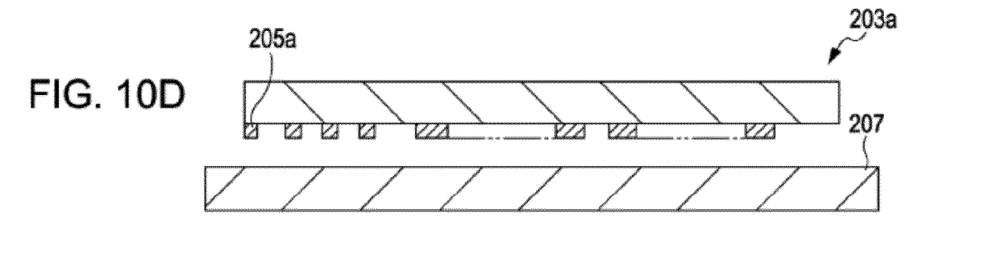
Figure 10E:
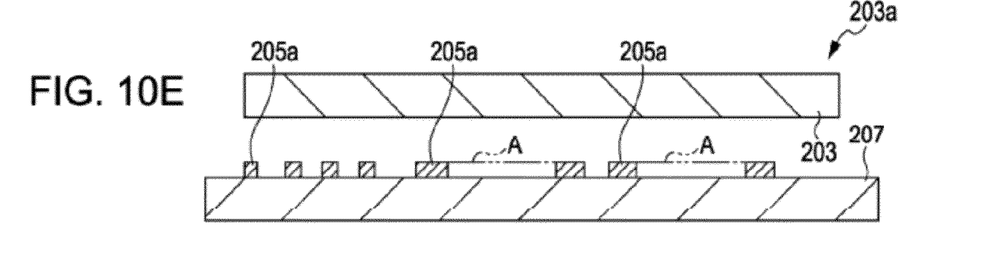

Next, as shown in FIG. 10D, the surface of the printing plate 203a provided with the ink pattern 205a is brought into tight contact with a substrate 207 for a display device. Subsequently, by peeling the printing plate 203a (blanket 203) off the substrate 207, as shown in FIG. 10E, the ink pattern 205a is formed on the substrate 207 by pattern transfer.

In such reverse printing, if the depressions 201a of the intaglio printing plate 201 have large apertures, as shown in FIG. 10B, the blanket 203 in tight contact with the intaglio printing plate 201 deflects and touches the bottoms of the depressions 201a. Consequently, when the blanket 203 is peeled off the intaglio printing plate 201, as shown in FIG. 10C, the conductive ink 205 is also transferred onto the bottoms of the depressions 201a, and lost portions A are formed in the ink pattern 205a left on the blanket 203. This causes printing failure. If the depth of the depressions 201a is increased to prevent this problem, pattern collapse occurs at fine depressions 201a.

Accordingly, Japanese Unexamined Patent Application Publication No. 2007-160769 proposes a structure in which a plurality of projections are provided in depressions having large apertures. This publication says that pattern loss of a conductive pattern (ink pattern) can be made negligibly small by sufficiently reducing the area ratio of the projections to the depressions.

Japanese Unexamined Patent Application Publication No. 2006-231827 discloses another method in which the depth of grooves in an intaglio printing plate are changed in several steps by performing sand blasting as well as wet etching using a mask. This publication says that the depth of depressions having large apertures can be selectively increased while limiting the number of wet etching operations and preventing formation of overhangs, and that the above-described printing failure can be prevented.

Japanese Unexamined Patent Application Publication No. 2007-5445 proposes a method in which different intaglio printing plates are formed respectively for a high-resolution portion and a low-resolution portion, different blankets each having an ink pattern are formed, and a plurality of pattern transfer operations are conducted on one substrate.

SUMMARY

However, in the method disclosed in Japanese Unexamined Patent Application Publication No. 2007-160769, pattern loss occurs in a print pattern having a large area, although the pattern loss is extremely small. For this reason, it is difficult to apply this method to printing of electrode portions, such as gate electrodes of thin-film transistors, which control the electric field.

In the method disclosed in Japanese Unexamined Patent Application Publication No. 2006-231827, since both wet etching and sand blasting are performed, the procedure is complicated. Moreover, it is difficult to form a pattern having a high resolution by sand blasting.

In the method disclosed in Japanese Unexamined Patent Application Publication No. 2007-5445, a plurality of different intaglio printing plates are formed, pattern transfer operations are performed using the intaglio printing plates, and transferred patterns are aligned. For this reason, the procedure is complicated, and it is difficult to ensure the positioning accuracy of the patterns.

It is desirable to provide an intaglio printing plate including a high-resolution transfer pattern that is accurately formed by printing through an easier procedure, and a production method for the intaglio printing plate. It is also desirable to provide an electronic substrate that achieves cost reduction by forming a conductive pattern by reverse printing using the printing plate, and a production method for the electronic substrate.

An intaglio printing plate according to an embodiment includes a substrate, and a photosensitive resin film provided on the substrate. The photosensitive resin film has a plurality of concave patterns whose depths increase as aperture widths increase.

In the above-described intaglio printing plate, a plurality of concave patterns whose depths increase as aperture widths increase are formed on the photosensitive resin film. For this reason, the concave patterns are formed by performing development using lithography under a condition where all concave patterns do not extend through the photosensitive resin film, and the concave patterns can be obtained by one lithography operation. The depths of the concave patterns increase as the aperture widths increase. Hence, it is possible to prevent pattern collapse by keeping the depths of fine patterns small, and to prevent a blanket pressed against the surface having the concave patterns from touching the bottoms of the concave patterns by keeping the depths of the large-area concave patterns large.

The intaglio printing plate includes a plurality of concave patterns whose depths increase as the aperture widths increase. Preferably, a depth d1 of the concave pattern having the largest aperture width W1, of the concave patterns, is set according to the following expression:

$$d1 > (A \times \rho \times W1^4) + (t \times \rho / E)$$

where ρ represents the pressure applied to a blanket having an ink layer when pressing the blanket against a surface of the intaglio printing plate having the concave patterns, E represents the Young's modulus of the blanket, t represents the thickness of the blanket, and A is a constant of the blanket.

In this intaglio printing plate, the depth d1 of the concave pattern having the largest aperture width W1 is more than the sum of the deflection amount and strain amount of the blanket pressed against the surface having the concave patterns. This prevents the blanket pressed against the surface having the concave patterns from touching the bottoms of the concave patterns having the aperture widths. Moreover, since the depth of fine concave patterns is kept small, pattern collapse is avoided.

A production method for an intaglio printing plate according to another embodiment includes the steps of forming a photosensitive resin film on a substrate; subjecting the photosensitive resin film to pattern exposure so as to form a plurality of concave patterns on the photosensitive resin film; and developing the photosensitive resin under a condition where the concave patterns have depths that increase as aperture widths increase.

In this production method, setting of the development condition allows concave patterns having depths that increase as aperture widths increase to be formed by one lithography operation.

A production method for an electronic substrate according to a further embodiment forms a conductive pattern on a device substrate by reverse printing using the intaglio printing plate produced by the above-described production method. A production method for a display device according to a still further embodiment forms a conductive pattern including a pixel electrode on a device substrate by reverse printing using the intaglio printing plate obtained by the above-described production method.

As described above, according to an embodiment, it is possible to produce an intaglio printing plate by one lithography operation while preventing pattern collapse and preventing a blanket from touching the bottoms of the concave patterns. As a result, it is possible to accurately form a high-resolution transfer pattern through an easier procedure, and to produce an electronic substrate and a display device with a high pattern accuracy at a low cost by using the printing method.

Additional features and advantages are described in, and will be apparent from, the following Detailed Description and the figures.

BRIEF DESCRIPTION OF THE FIGURES

FIGS. 8A-1, 8A-2, 8B-1, and 8B-2 are photomicrographs of portions in a production procedure according to an example;

DETAILED DESCRIPTION

The present application will be described in detail below with reference to the drawings according to an embodiment.

First Production Method for Intaglio Printing Plate

FIGS. 1A to 1D are cross-sectional step views illustrating a production method for an intaglio printing plate according to a first embodiment. A production method for an intaglio printing plate for use in reverse printing according to the first embodiment will now be described with reference to these figures.

Figure 1A:
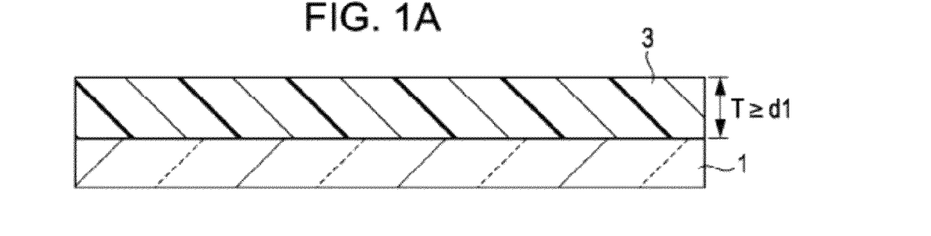
FIGS. 1A to 1D are cross-sectional step views illustrating a production method for an intaglio printing plate according to a first embodiment.

First, as shown in FIG. 1A, a negative photosensitive resin film 3 is formed on a substrate 1 made of glass or the like. In this case, it is important to form the photosensitive resin film 3 so that a thickness T of the photosensitive resin film 3 is more than or equal to a depth d1 of a concave pattern having the largest aperture width W1, of concave patterns to be formed on the photosensitive resin film 3. The depth d1 of the concave pattern having the largest aperture width W1 will be described below.

Figure 1B:
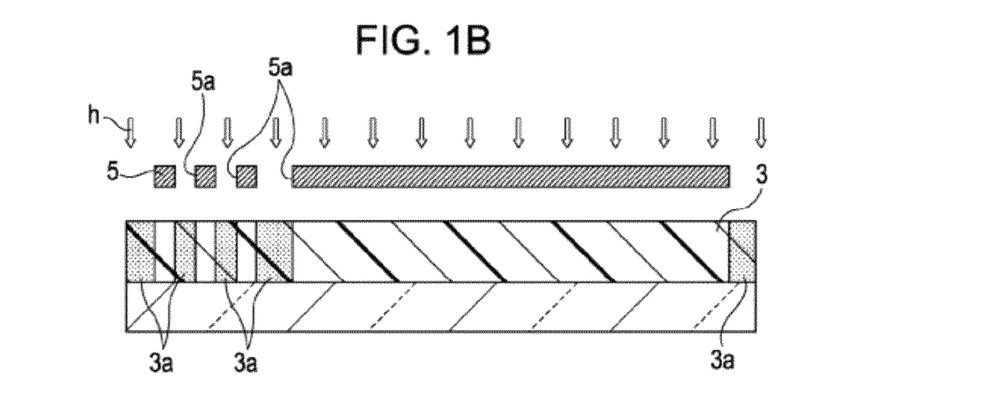

Next, as shown in FIG. 1B, the photosensitive resin film 3 is subjected to pattern exposure. In this case, exposure light h is not applied to portions of the photosensitive resin film 3 where concave patterns are to be formed, but is selectively applied to the other portions 3a. In the portions 3a exposed to the exposure light h, the exposure condition is set so that the photosensitive resin is sufficiently photopolymerized and cured over the entire region of the photosensitive resin film 3 in the depth direction. For example, this pattern exposure may be performed using an exposure mask 5 having windows 5a through which the exposure light h passes, or may be performed by direct writing without using the exposure mask 5.

Figure 1C:
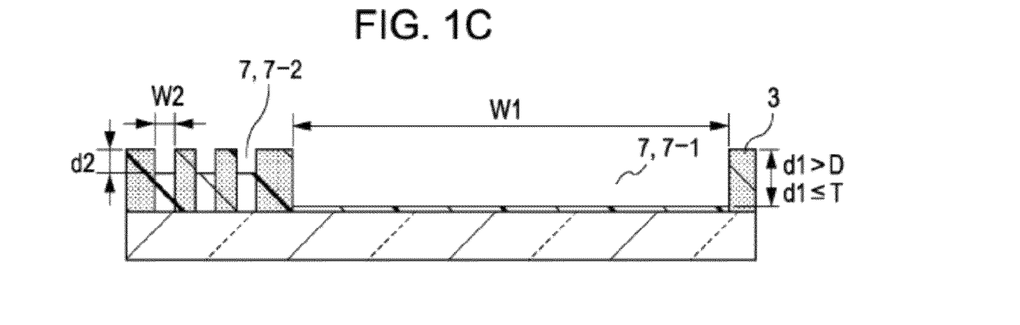

Next, by developing the photosensitive resin film 3 after pattern exposure, as shown in FIG. 1C, unexposed portions of the photosensitive resin film 3 are dissolved in a developing liquid so as to form concave patterns 7. In this case, it is important to develop the photosensitive resin film 3 so that the depth d1 of concave patterns 7-1 having the largest aperture width W1, of the concave patterns 7, exceeds a predetermined designed value D and so that the concave patterns 7 have depths that increase as the aperture widths increase. To perform such development, the difference in dissolvability between the unexposed portions of the negative photoresist in the developing liquid is utilized. Thus, development is performed so that the depth d1 of the concave patterns 7-1 having the largest aperture width W1 is more than the designed value D and so that development is not completed in the fine patterns 7-2 while the photosensitive resin remains at the bottoms of the fine concave patterns 7-2.

Figure 2A:
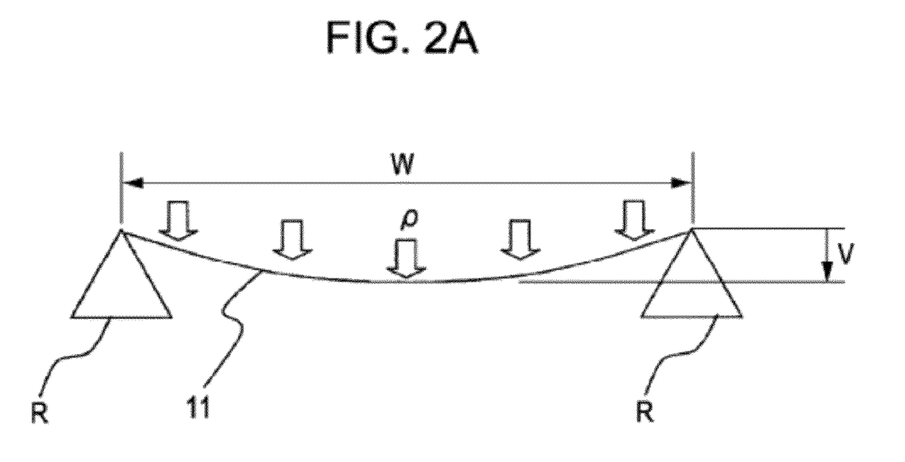
FIGS. 2A and 2B explain calculation of the displacement amount of a blanket.
Figure 2B:
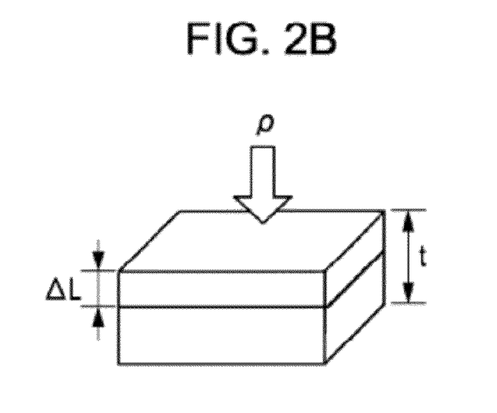

The above-described designed value D for specifying the depth d1 of the concave patterns 7-1 having the largest aperture width W1 is determined according to the characteristic of a blanket used in reverse printing with the produced intaglio printing plate, as follows:

That is, as shown in FIGS. 2A and 2B, in reverse printing, a blanket 11 having an ink layer is pressed against a surface of an intaglio printing plate on which patterns are provided. For this reason, first, when the blanket 11 provided to close an opening having a predetermined width W in a structure body R is pressed against the structure body R with an applied pressure ρ similar to the pressure in printing, the sum of a compression amount ΔL due to strain of the blanket 11 and a deflection amount V of the blanket 11 is defined as a set value D. In other words, the set value D=the deflection amount V+the compression amount ΔL.

Here, the deflection amount V=the constant A of the blanket×the applied pressure ρ×the aperture width W4. However, since the constant A (100 Pa−1×m−4) differs among different blankets, it is preferably found beforehand by making a preliminary test for pressing the blanket against structure bodies R having different aperture widths W.

According to the Hooke's law, the compression amount ΔL=the thickness t of the blanket×the applied pressure ρ/Young's modulus E of the blanket.

Therefore, the set value D=(ΔA×ρ×W⁴)+(t×ρ/E).

Referring again to FIG. 1C, the photosensitive resin film 3 is developed so that the depth d1 of the concave patterns 7-1 having the largest aperture width W1 satisfies the following Conditional Expression (1):

$$d1 > (A \times \rho \times W1^4) + (t \times \rho/E) \quad (1)$$

As another condition for development, it is important to stop development so that the depths of the concave patterns increase in accordance with the aperture widths, as described above, that is, before all unexposed portions are removed by development. To perform such development, the difference in dissolvability of the negative photoresist in the developing liquid is utilized. Development is performed so that the depth d1 of the concave patterns 7-1 having he largest aperture width W1 is more than the designed value D and so that so that development is not completed in the fine patterns 7-2 while the photosensitive resin remains at the bottoms of the fine concave patterns 7-2. Thus, a plurality of concave patterns 7 are formed so as to have different depths corresponding to different aperture widths. In this case, it is preferable to perform development so that the aspect ratio of the concave patterns 7 having the aperture widths W1 and W2 is about 1:1 or less.

Figure 1D:
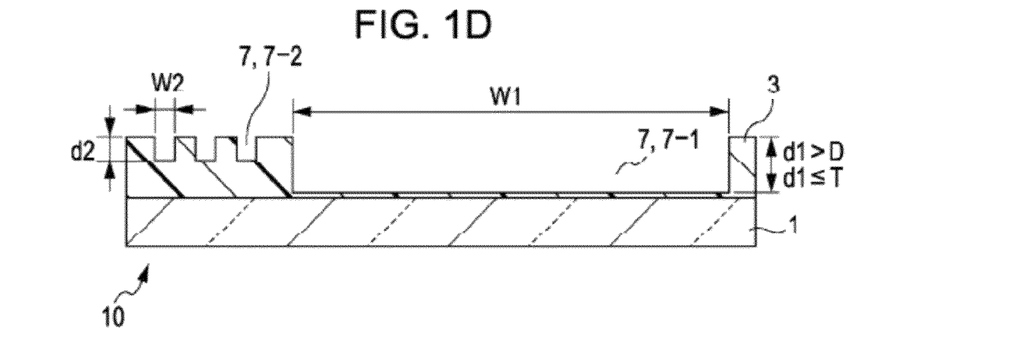

After that, as shown in FIG. 1D, the photosensitive resin film 3 on which a plurality of concave patterns 7 are formed is dried and entirely exposed again, thus curing the unexposed portions. Subsequently, the photosensitive resin film 3 is cured in tight contact by baking.

In an intaglio printing plate 10 obtained, as described above, the photosensitive resin film 3 is provided with a plurality of concave patterns 7 having the depths d1 and d2 set corresponding to the aperture widths W1 and W2.

In the above-described production method for the intaglio printing plate according to the first embodiment, setting of the development condition allows concave patterns whose depths increase as the aperture widths increases to be formed by one lithography operation. Therefore, it is possible to produce the intaglio printing plate 10 in one lithography operation while avoiding pattern collapse and preventing the blanket from touching the bottoms of the concave patterns 7. Further, in the intaglio printing plate 10, both large-area patterns and fine patterns can be formed through an easier procedure. Moreover, since the concave patterns 7 are formed by lithography, they can be obtained with a high shape accuracy.

Second Production Method for Intaglio Printing Plate

FIGS. 3A to 3D are cross-sectional step views illustrating a production method for an intaglio printing plate according to a second embodiment. A production method for an intaglio printing plate of the second embodiment for use in reverse printing will be described below with reference to these figures. The production method shown in these figures uses a positive photosensitive resin film.

Figure 3A:
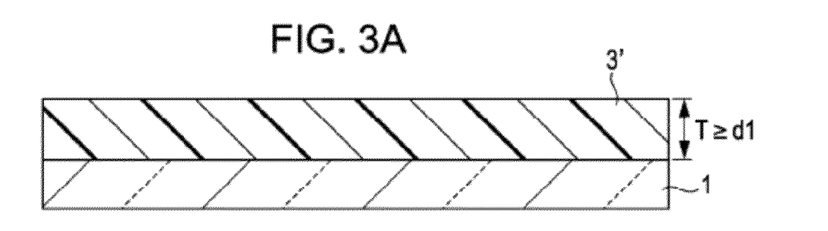
FIGS. 3A to 3D are cross-sectional step views illustrating a production method for an intaglio printing plate according to a second embodiment.

First, as shown in FIG. 3A, a positive photosensitive resin film 3' is formed on a substrate 1 made of glass or the like. Similarly to the first embodiment, it is important to form the photosensitive resin film 3' with a thickness T that is more than or equal to a depth d1 of concave patterns having the largest aperture width W1, of concave patterns to be formed on the photosensitive resin film 3'.

Figure 3B:
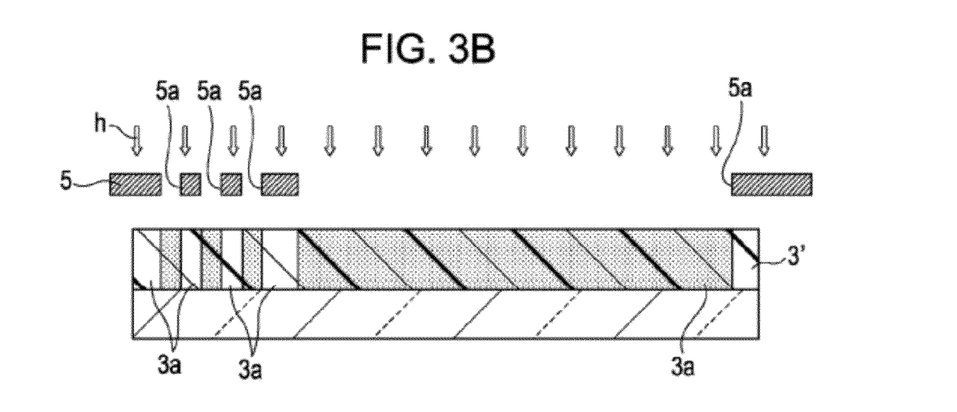

Next, as shown in FIG. 3B, the photosensitive resin film 3' is subjected to pattern exposure. In this case, unlike the first embodiment, exposure light h is selectively applied to portions of the photosensitive resin film 3' where concave patterns are to be formed, but is not applied to the other portions 3a. The exposure condition is set so that the photosensitive resin is sufficiently photolyzed in the portions irradiated with the exposure light h over the entire region of the photosensitive resin film 3' in the depth direction. Similarly to the first embodiment, such pattern exposure is performed using an exposure mask 5 having windows 5a through which the exposure light h passes, or is performed by direct writing without using the exposure mask 5.

Figure 3C:
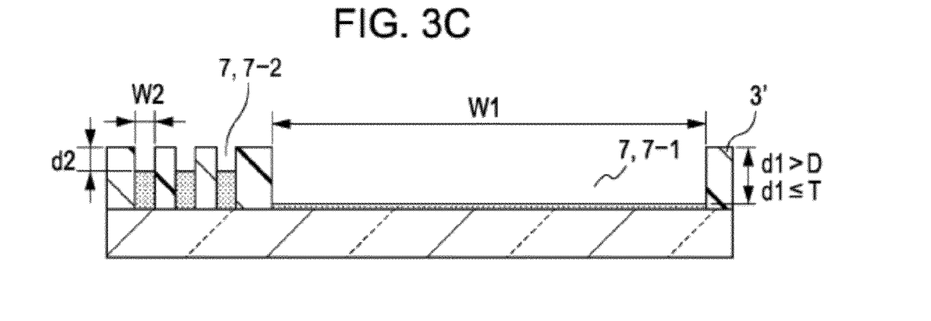

Next, by developing the photosensitive resin film 3' after pattern exposure, as shown in FIG. 3C, exposed portions of the photosensitive resin film 3' are dissolved in a developing liquid, thus forming concave patterns 7. Similarly to the first embodiment, it is important to develop the photosensitive resin film 3' so that a depth d1 of concave patterns 7-1 having the largest aperture width W1, of the concave patterns 7, exceeds a predetermined designed value D and so that the depths of the concave patterns 7 increase as the aperture widths increase. To perform such development, the difference in dissolubility of the positive photoresist in the developing liquid after pattern exposure is utilized. Thus, development is performed so that the depth d1 of the concave patterns 7-1 having the largest aperture width W1 is more than the designed value D and so that development is not completed in fine patterns 7-2 while the photosensitive resin remains at the bottoms of the fine concave patterns 7-2.

The above-described designed value D for specifying the depth d1 of the concave patterns 7-1 having the largest aperture width W1 is determined in a manner similar to that adopted in the first embodiment described with reference to FIG. 2. Further, similarly to the first embodiment, the photosensitive resin film 3' is developed so that the depth d1 of the concave patterns 7-1 having the largest aperture width W1 satisfies the following Conditional Expression (1):

$$d1 > (A \times \rho \times W1^4) + (t \times \rho/E) \quad (1)$$

Similarly to the first embodiment, as another condition for development, it is important to stop development so that the depths of the concave patterns 7 increase in accordance with the aperture widths, as described above, that is, before all exposed portions are removed by development. When development is performed to an extent such all exposed portions are not removed by exposure, it proceeds more deeply as the aperture widths of the concave patterns 7 increase. For this reason, a plurality of concave patterns 7 are formed so that the depths thereof increase as the aperture widths increase.

Figure 3D:
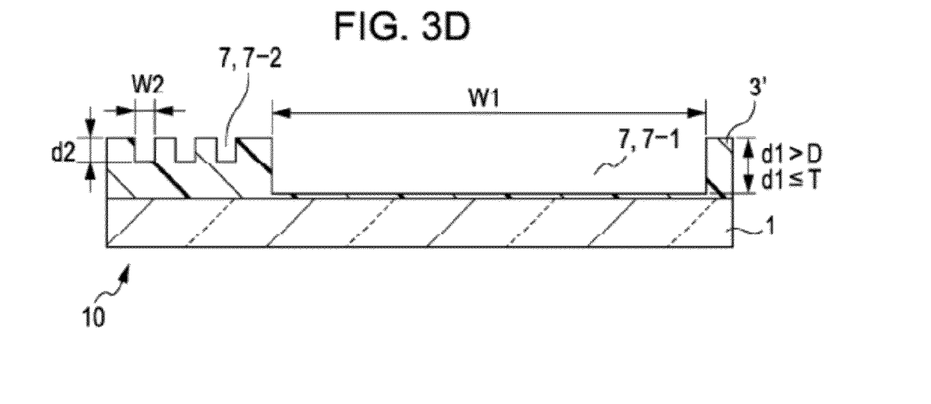

After that, as shown in FIG. 3D, the photosensitive resin film 3' provided with a plurality of concave patterns 7 is dried, baked, and thereby cured in tight contact.

In an intaglio printing plate 10 obtained, as described above, the photosensitive resin film 3' is provided with a plurality of concave patterns 7 whose depths d1 and d2 are set corresponding to the aperture widths W1 and W2.

In the above-described production method for the intaglio printing plate of the second embodiment, setting of the development condition also allows concave patterns, whose depths increase as the aperture widths increase, to be formed by one lithography operation. Therefore, it is possible to produce the intaglio printing plate 10 by one lithography operation while avoiding pattern collapse and preventing the blanket from touching the bottoms of the concave patterns 7. Further, in the intaglio printing plate 10, both large-area patterns and fine patterns can be formed through an easier procedure. Moreover, since the concave patterns 7 are formed by lithography, they can be obtained with a high shape accuracy.

While the intaglio printing plate 10 shaped like a flat plate is produced in the above-described first and second embodiments, a cylindrical (roll-shaped) intaglio printing plate can be produced similarly, and similar advantages can be obtained.

Production Method for Electronic Substrate

A method for producing an electronic substrate with the intaglio printing plate 10 obtained by the above-described production method will now be described. Here, a description will be given of a production method for a driving substrate (so-called back plane) in a liquid crystal display device shown in FIG. 4A serving as a circuit diagram and FIG. 4B serving as a plan view of a pixel section, as an example of an electronic substrate.

Figure 4A:
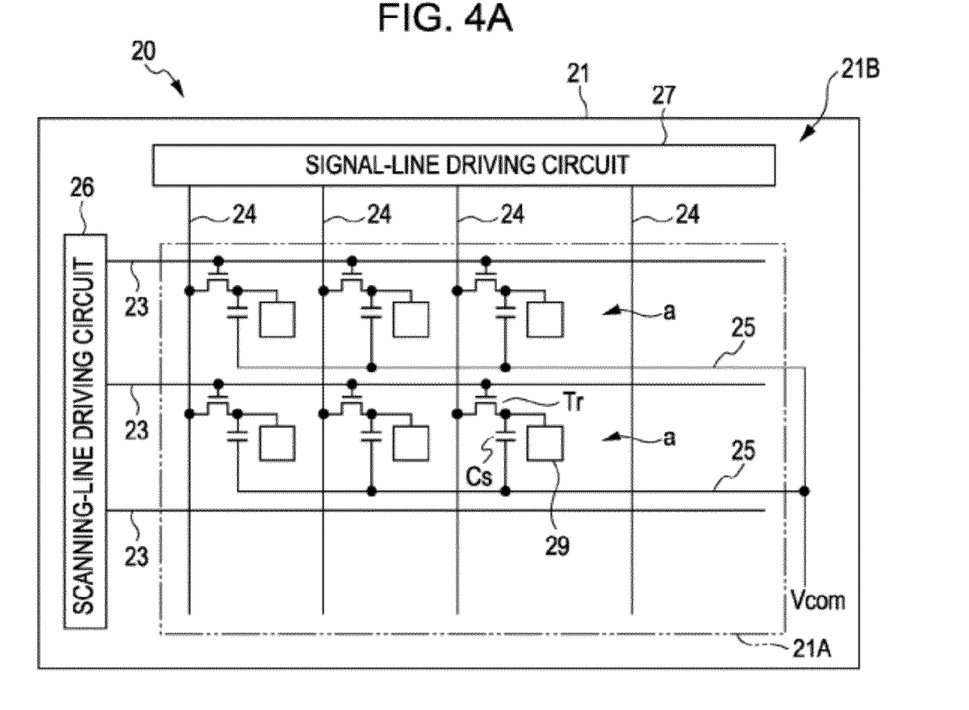
FIGS. 4A and 4B illustrate a configuration of a driving substrate provided as an electronic substrate in a liquid crystal display device.

First, a configuration of an electronic substrate 20 will be described. A display region 21A and a peripheral region 21B are set in a base material and a substrate (hereinafter referred to as a device substrate) of the electronic substrate 20 to be produced. In the display region 21A, a plurality of scanning lines 23 and a plurality of signal lines 24 extend vertically and horizontally, and form a pixel array section in which one pixel "a" is provided corresponding to each of the intersections of the lines. Further, a plurality of common lines 25 extend parallel to the scanning lines 23 in the display region 21A. On the other hand, a scanning-line driving circuit 26 for driving the scanning lines 23 and a signal-line driving circuit 27 for supplying a picture signal (i.e., an input signal) according to luminance information to the signal lines 24 are provided in the peripheral region 21B.

Figure 4B:
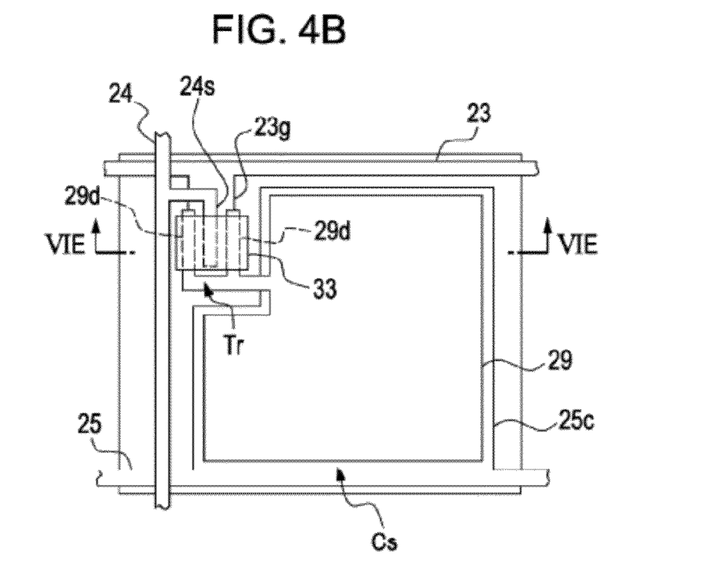

In each pixel a, for example, a pixel circuit including a thin-film transistor Tr serving as a switching element and a retention capacity Cs is provided. Also, a pixel electrode 29 is connected to the pixel circuit. The retention capacity Cs is provided between a lower electrode 25c extending from the corresponding common line 25 and the pixel electrode 29. The thin-film transistor Tr includes a gate electrode 23g extending from the corresponding scanning line 23, a source 24s extending from the corresponding signal line 24, and a drain 29d extending from the pixel electrode 29. The thin-film transistor Tr also includes a semiconductor layer 33 extending from the source 24s to the drain 29d.

A picture signal written from the signal line 24 via the thin-film transistor Tr is retained in the retention capacity Cs, and a voltage in accordance with the retained signal amount is supplied to the pixel electrode 29.

On the device substrate 21 having the above-described circuit, a separation insulating film and an alignment film, which are not shown, are also provided.

The electronic substrate 20 having the above-described configuration is produced through the following procedure.

Figure 5A:
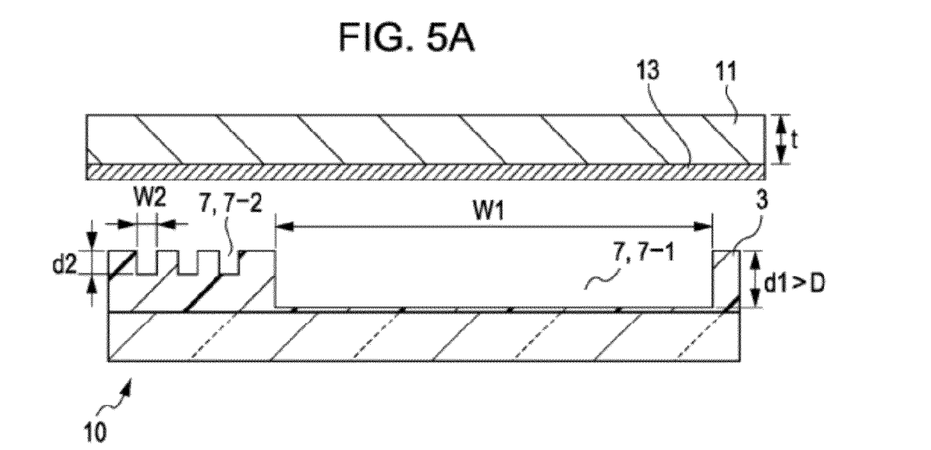
FIGS. 5A to 5C are cross-sectional step views (first) illustrating a production method for an electronic substrate using the produced intaglio printing plate.

First, as shown in FIG. 5A, an intaglio printing plate 10 is produced through the procedure of the above-described first or second embodiment. The intaglio printing plate 10 is used to form large-area pixel electrodes having a large area and fine lines and electrode portions that are provided in the same layer as that of the large-area pixel electrodes. Therefore, concave patterns 7-1 having the largest aperture width W1 and the largest depth d1 are provided corresponding to the large-area pixel electrodes. Further, concave patterns 7-2 having a small aperture width W2 (<W1) and a small depth d2 (<d1) are provided corresponding to the other fine lines and electrode portions.

Then, a blanket 11 is placed to face a surface of the intaglio printing plate 10 where the concave patterns 7 are provided. The blanket 11 is formed by a flat plate having a releasable surface, and has a conductive ink layer 13 on the releasable surface. The intaglio printing plate 10 and the blanket 11 are placed to face each other so that the conductive ink layer 13 and the concave patterns 7 face each other. The blanket 11 is similar to a blanket that is used in a preliminary test for calculating a designed value D that determines the depth d1 of the concave pattern 7-1 having the largest aperture width W1.

Figure 5B:
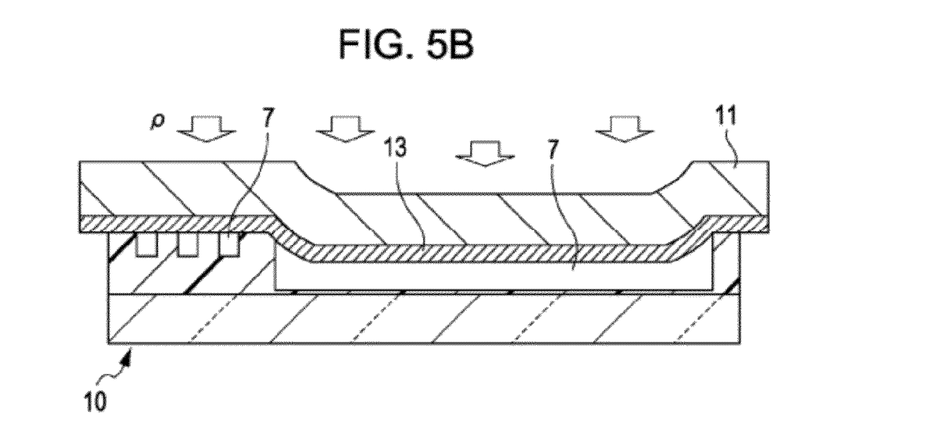

Next, as shown in FIG. 5B, the blanket 11 is pressed against the surface of the intaglio printing plate 10, where the concave patterns 7 are provided, with an applied pressure ρ, so that portions of the conductive ink layer 13 that touch the intaglio printing plate 10 are transferred onto the intaglio printing plate 10. In this case, the conductive ink layer 13 on the blanket 11 does not touch the bottoms of the concave patterns 7.

Figure 5C:
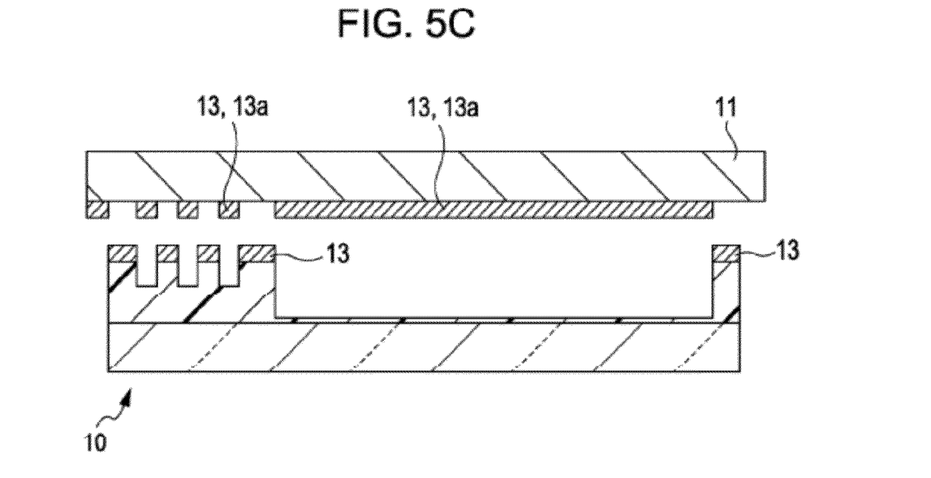

After that, as shown in FIG. 5C, the blanket 11 is peeled off the intaglio printing plate 10. The portions of the conductive ink layer 13 which have been removed from the blanket 11 by transfer onto the intaglio printing plate 10 are formed as ink patterns 13a on the blanket 11, thus obtaining a printing plate. Of the ink patterns 13a, large-area pattern portions serve as gate-electrode forming portions, and fine pattern portions serve as portions for forming sources/drains and signal lines.

Figure 6A:
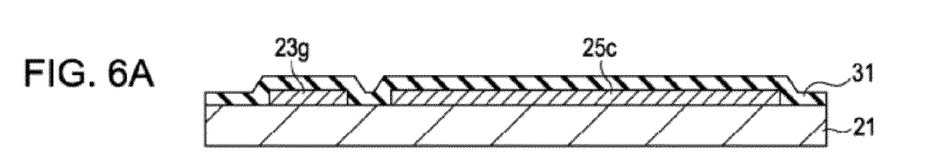
FIGS. 6A to 6F are cross-sectional step views (second) illustrating the production method for the electronic substrate using the produced intaglio printing plate.

Separately from the above-described procedure for forming the printing plate, a part of a pixel driving circuit is formed on a device substrate 21 of an electronic substrate, as shown in FIG. 4A. In this case, as shown in FIG. 6A, scanning lines and gate electrodes 23g connected thereto and common lines and lower electrodes 25c connected thereto are formed on the device substrate 21. These lines and electrodes are formed by, for example, printing. Next, a gate insulating film 31 is formed to cover the lines and electrodes.

Figure 6B:
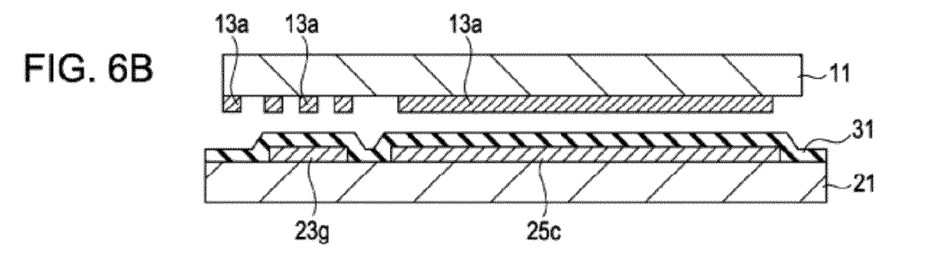

Next, as shown in FIG. 6B, the blanket 11 (printing plate) having the ink patterns 13a formed through the above-described procedure is placed to face a side of the device substrate 21 where the gate insulating film 31 is provided. In this case, the gate insulating film 31 and the ink patterns 13a face each other. Further, large-area pattern portions (gate-electrode forming portions) face the lower electrodes 25c on the device substrate 21, and fine pattern portions (sources/drain/signal-line forming portions) face the gate electrodes 23g.

Figure 6C:
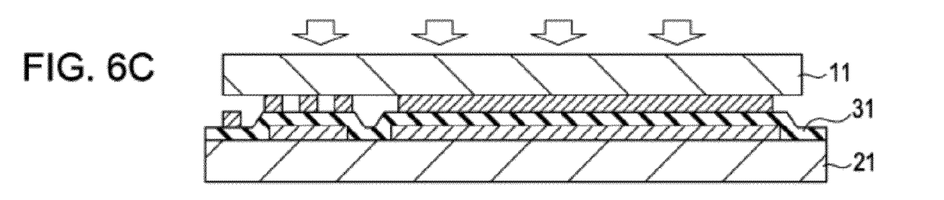

In this state, as shown in FIG. 6C, the blanket 11 is pressed against the gate insulating film 31 of the device substrate 21.

Figure 6D:
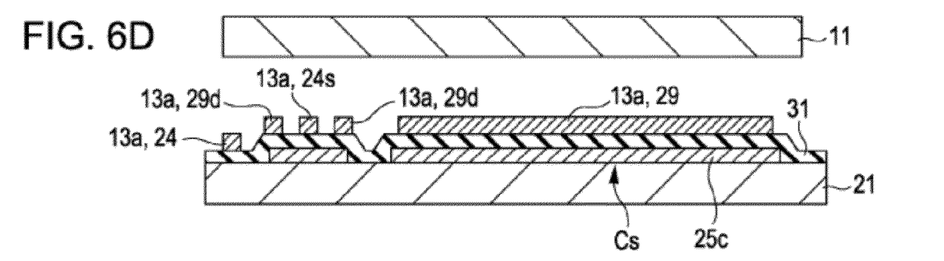

Subsequently, as shown in FIG. 6D, the blanket 11 is peeled off the device substrate 21. Thus, the ink patterns 13a on the blanket 11 are transferred onto the gate insulating film 31, and pixel electrodes 29 having a large area, fine drains 29d, signal lines 24, and sources 24s are formed.

Figure 6E:
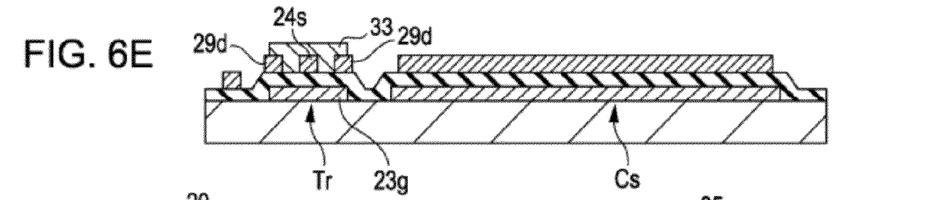

After that, as shown in FIG. 6E serving as a cross sectional view, taken along line VIE-VIE in FIG. 4B serving as a plan view, semiconductor layers 33 extending between the sources 24s and the drains 29d are patterned on the gate electrodes 23g by, for example, printing.

Figure 6F:
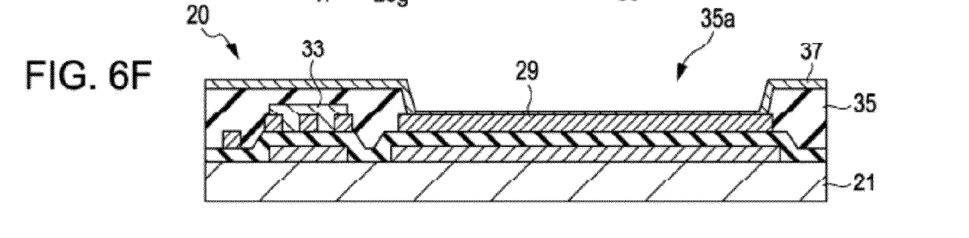

Next, as shown in FIG. 6F, a separation insulating film 35 is formed to have a shape such as to cover the peripheries of the pixel electrodes 29 and the semiconductor layers 33, and the pixel electrodes 29 are widely exposed at the bottoms of windows 35a of the separation insulating film 35. Then, an alignment film 37 is formed above the device substrate 21 so as to cover the separation insulating film 35 and the pixel electrodes 29.

Through the above-described procedure, the driving substrate (electronic substrate) 20 is completed.

Production Method for Display Device

A description will now be given of a production method for a liquid crystal display device with the driving substrate (electronic substrate) 20 produced by the above-described method.

Figure 7:
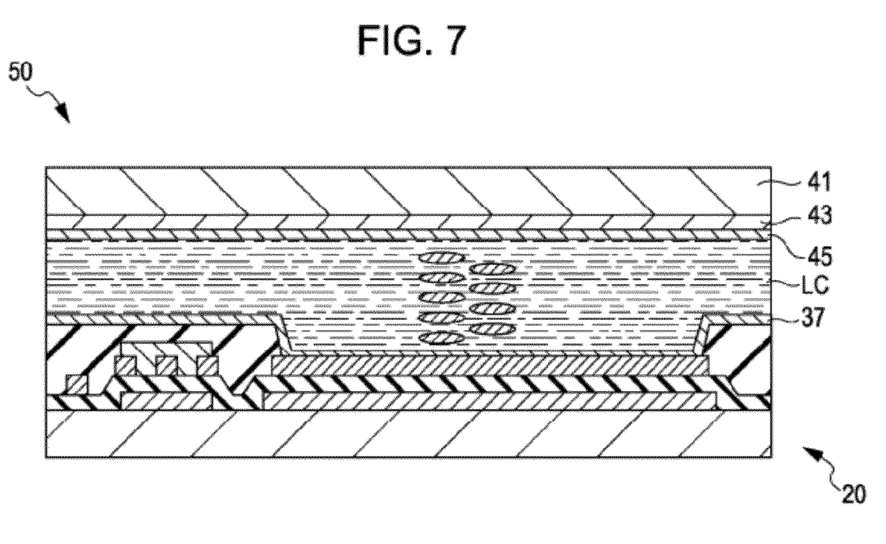
FIG. 7 is a cross-sectional view illustrating a production method for a display device using the produced electronic substrate.

First, as shown in FIG. 7, a counter substrate 41 to face the driving substrate 20 is prepared, and a common electrode 43 and an alignment film 45 are formed in that order on one principal surface of the counter substrate 41. Under the common electrode 43 of the counter substrate 41, necessary members (not shown), such as a color filter and a retardation layer, are provided.

Next, the driving substrate 20 and the counter substrate 41 are placed to face each other so that the alignment films 37 and 45 face each other and a spacer (not shown) is clamped therebetween, and a liquid crystal layer LC is filled between the substrates 20 and 41 and sealed on the periphery. Thus, a liquid crystal display device 50 is completed.

According to the production method for the electronic substrate 20 and the subsequent production method for the display device 50 described above, it is possible to form the large-area pixel electrodes 29 and the fine electrodes and wiring patterns by one lithography operation in reverse printing using the intaglio printing plate 10 that can prevent pattern collapse and prevent the blanket from touching the bottoms of the concave patterns. As a result, it is possible to accurately form conductive patterns with an easier procedure and to produce the electronic substrate 20 and the display device 50 at a lower cost.

While the production method for the electronic substrate and the production method for the display device are applied to production of a liquid crystal display device in the above-described embodiment, the production method for the display device according to an embodiment is not limited to production of a liquid crystal display device, and is also suitable for production of a display device, such as an active-matrix display device, in which large-area conductive patterns (e.g., pixel electrodes) and fine conductive patterns (wires and so on) are mixed in the same layer. More specifically, the production method according to the embodiment is suitable for production of a display device using an organic electroluminescence element. Further, the production method for the electronic substrate according to the embodiment is not limited to production of a driving substrate in a display device, and is also suitable for production of an electronic substrate in which large-area conductive patterns and fine conductive patterns are mixed in the same layer. In this case, similar advantages can also be obtained.

EXAMPLE

An example will be described with reference to the drawings.

First, as shown in FIG. 1A, a photosensitive resin film 3 having a thickness of 3.3 μm was formed by applying a negative resist (SU8: the trade name of a product from MicroChem Corp.) on a glass substrate 1. Then, as shown in FIG. 1B, pattern exposure was performed with a photomask 5. Next, as shown in FIG. 1C, development was performed with a developing agent so that depths d1 and d2 could be provided respectively corresponding to aperture widths W1 and W2. Subsequently, as shown in FIG. 1D, drying was performed, entire exposure was performed again, and baking was performed to cure the photosensitive resin film 3 in tight contact with the glass substrate 1, so that an intaglio printing plate 10 was produced.

Conditions for producing the intaglio printing plate 10 are as follows:

Largest aperture width of concave pattern: 200 μm
Largest depth d1 of concave pattern: 3.3 μm
Applied Pressure (highest) ρ: 20 kPaE
Young's modulus of blanket: 3 MPa
Thickness t of blanket: 200 μm
Constant A of blanket: 100 Pa×m$^{-4}$ From the above, the depth d1 at the largest aperture width W1=3.3 μm>the set value $D=(A \times \rho \times W1^4)+(t \times \rho/E) \approx 1.3$. Thus, the condition described in the embodiment was satisfied.

Next, as shown in FIG. 5A, an ink layer 13 of an Ag colloid ink was formed on a releasable surface of a PDMS blanket (E blanket=3 Mpa) having a thickness t of 200 nm. The blanket was pressed against the intaglio printing plate 10 with an applied pressure ρ of 20 kPa, as shown in FIG. 5B. Then, ink patterns 13a were formed by peeling the blanket 11 off the intaglio printing plate 10, as shown in FIG. 5C. Reverse printing was performed by pressing the blanket 11 against a substrate (applied pressure=20 kPa), so that conductive pattern of an Ag paste were formed on the substrate. Subsequently, the Ag paste was baked, and large-area patterns having the largest aperture width W1 of 200 μm and fine patterns having an aperture width W2 of 1 μm were obtained.

Figure 8A:
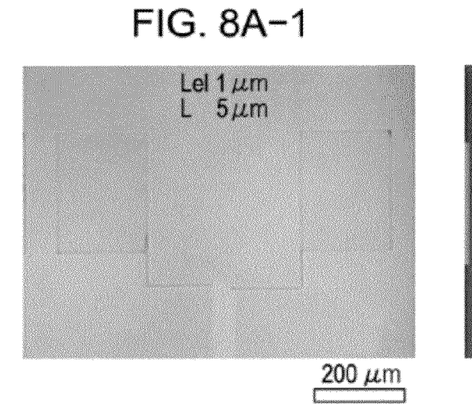
Figure 8A:
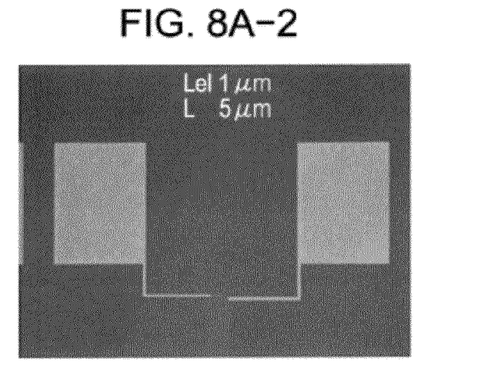
Figure 8B:
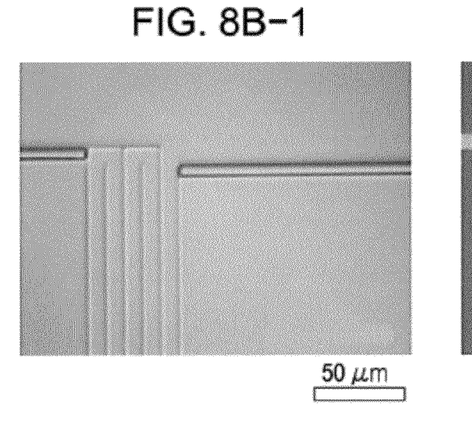
Figure 8B:
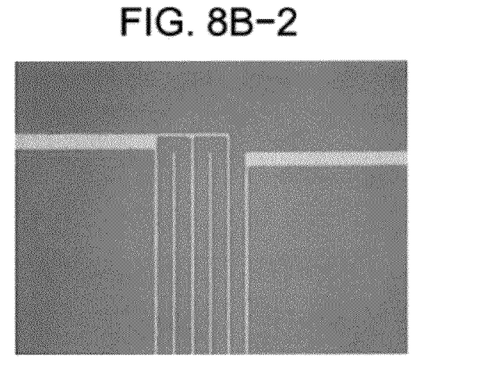

FIGS. 8A-1, 8A-2, 8B-1, and 8B-2 are photomicrographs of the elements in the above-described example. FIG. 8A-1 shows portions of the intaglio printing plate corresponding to the large-area patterns. FIG. 8A-2 shows obtained large-area patterns. FIG. 8B-1 shows portions of the intaglio printing plate corresponding to fine patterns. FIG. 8B-2 shows obtained fine patterns.

As shown in the photomicrographs, it was verified that there was no pattern loss in the large-area patterns, that the fine patterns were not influenced by pattern collapse, and that the patterns could be formed with a high shape accuracy by reverse printing.

COMPARATIVE EXAMPLE

Printing was performed in the same procedure as that of the above-described example except that a photosensitive resin film 3 on a glass substrate 1 had a thickness T of 1.3 μm. In this case, the depth d1 at the largest aperture width W1=1.2 μm<the set value $D=(A \times \rho \times W1^4)+(t \times \rho/E) \approx 1.3$. Thus, the condition described in the embodiment was not satisfied.

Figure 9:
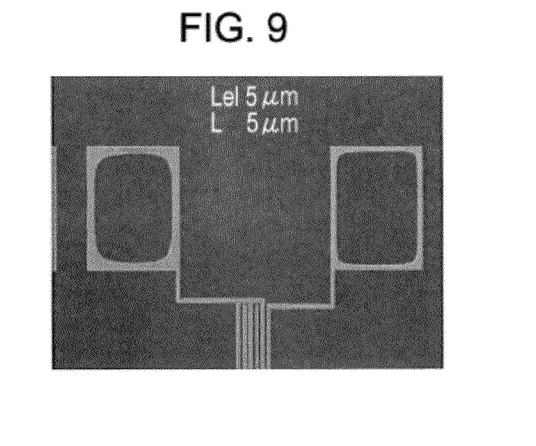
FIG. 9 is a photomicrograph of a printing pattern formed in a comparative example.

FIG. 9 is a photomicrograph of a printing pattern printed in the above-described comparative example. As shown in FIG. 9, pattern loss occurred in wide center portions of the large-area patterns.

The present application contains subject matter related to that disclosed in Japanese Priority Patent Application JP 2008-126823 filed in the Japan Patent Office on May 14, 2008, the entire content of which is hereby incorporated by reference.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A production method for an intaglio printing plate, comprising:

forming a photosensitive resin film on a substrate;

subjecting the photosensitive resin film to pattern exposure so as to form a plurality of concave patterns each having a depth on the photosensitive resin film; and developing the photosensitive resin film under a condition where the concave patterns have depths that increase as aperture widths increase;

wherein the photosensitive resin film is developed under a condition where a depth d1 of the concave pattern having the largest aperture width W1, of the concave patterns, satisfies the following expression:

$$d1 > (A \times \rho \times W1^4) + (t \times \rho / E)$$

where $\rho$ represents the pressure applied to a blanket having an ink layer when pressing the blanket against a surface of the intaglio printing plate having the concave patterns, E represents the Young's modulus of the blanket, t represents the thickness of the blanket, and A is a constant of the blanket; and calculating the constant A by a preliminary experiment before the step of forming the photosensitive resin film.

2. A production method for an electronic substrate, comprising:

producing an intaglio printing plate in which a photosensitive resin film having a plurality of concave patterns each having a depth are provided on a substrate, wherein the depths of the concave patterns increase as aperture widths increase;

pressing a blanket having a conductive ink layer against a surface of the intaglio printing plate having the concave patterns and peeling off the blanket in a state in which the conductive ink layer faces the surface, and forming an ink pattern by a part of the conductive ink layer left on the blanket by peeling off the blanket; and forming a conductive pattern by transferring the ink pattern from the blanket onto a device substrate;

wherein the photosensitive resin film is developed under a condition where a depth d1 of the concave pattern having the largest aperture width W1, of the concave patterns, satisfies the following expression:

$$d1 > (A \times \rho \times W1^4) + (t \times \rho / E)$$

where $\rho$ represents the pressure applied to a blanket having an ink layer when pressing the blanket against a surface of the intaglio printing plate having the concave patterns, E represents the Young's modulus of the blanket, t represents the thickness of the blanket, and A is a constant of the blanket; and calculating the constant A by a preliminary experiment before the step of forming the photosensitive resin film.

3. A production method for a display device, comprising:

producing an intaglio printing plate in which a photosensitive resin film having a plurality of concave patterns each having a depth are provided on a substrate, wherein the depths of the concave patterns increase as aperture widths increase;

pressing a blanket having a conductive ink layer against a surface of the intaglio printing plate having the concave patterns and peeling off the blanket in a state in which the conductive ink layer faces the surface, and forming an ink pattern by a part of the conductive ink layer left on the blanket by peeling off the blanket; and forming a conductive pattern including a pixel electrode by transferring the ink pattern from the blanket onto a device substrate;

wherein the photosensitive resin film is developed under a condition where a depth d1 of the concave pattern having the largest aperture width W1, of the concave patterns, satisfies the following expression:

$$d1 > (A \times \rho \times W1^4) + (t \times \rho / E)$$

where $\rho$ represents the pressure applied to a blanket having an ink layer when pressing the blanket against a surface of the intaglio printing plate having the concave patterns, E represents the Young's modulus of the blanket, t represents the thickness of the blanket, and A is a constant of the blanket; and calculating the constant A by a preliminary experiment before the step of forming the photosensitive resin film.

* * * * *